United States Patent
Kim et al.

(10) Patent No.: US 9,921,274 B2
(45) Date of Patent: Mar. 20, 2018

(54) SENSING APPARATUS USING GROUPS OF HALL SENSORS AND APPARATUS USING THE SENSING APPARATUS

(71) Applicant: Haechitech Corporation, Cheongju-si (KR)

(72) Inventors: Eun Joong Kim, Namyangju-si (KR); Seong Min Choe, Seongnam-si (KR)

(73) Assignee: Haechitech Corporation, Cheongju-si (KR)

( * ) Notice: Subject to any disclaimer, the term of this patent is extended or adjusted under 35 U.S.C. 154(b) by 175 days.

(21) Appl. No.: 14/534,547

(22) Filed: Nov. 6, 2014

(65) Prior Publication Data

US 2015/0316394 A1 Nov. 5, 2015

(30) Foreign Application Priority Data

Apr. 30, 2014 (KR) ........................ 10-2014-0052766

(51) Int. Cl.
- G01D 5/14 (2006.01)
- G01R 33/00 (2006.01)
- G01R 33/07 (2006.01)
- G01R 33/10 (2006.01)

(52) U.S. Cl.
CPC ......... G01R 33/0094 (2013.01); G01D 5/145 (2013.01); G01R 33/072 (2013.01); G01R 33/10 (2013.01)

(58) Field of Classification Search
CPC .......... G01D 5/14; G01R 15/20; G01R 33/07; G01R 33/02; G01R 33/038; H01L 43/06

USPC .......................................................... 324/207
See application file for complete search history.

(56) References Cited

U.S. PATENT DOCUMENTS

| | | | |
|---|---|---|---|
| 5,679,973 A * | 10/1997 | Mochizuki | H01L 43/06 257/421 |
| 5,694,040 A * | 12/1997 | Plagens | G01D 3/036 324/207.2 |
| 6,356,741 B1 | 3/2002 | Bilotti et al. | |
| 6,606,085 B1 | 8/2003 | Endo et al. | |
| 6,701,166 B2 | 3/2004 | Lim | |
| 6,784,659 B2 * | 8/2004 | Haji-Sheikh | G01D 5/145 324/174 |
| 7,085,119 B2 | 8/2006 | Bilotti et al. | |
| 7,196,316 B2 * | 3/2007 | Chan | H04M 1/605 250/221 |
| 7,307,824 B2 | 12/2007 | Bilotti et al. | |
| 7,637,024 B2 | 12/2009 | Amundson et al. | |
| 9,547,050 B2 * | 1/2017 | Sartee | G01R 33/07 |
| 2006/0044094 A1 * | 3/2006 | Davis | A63H 33/26 335/220 |

(Continued)

FOREIGN PATENT DOCUMENTS

| | | | |
|---|---|---|---|
| JP | 63-241303 A | 10/1988 | |
| JP | 6-149474 A | 5/1994 | |

(Continued)

Primary Examiner — Son Le
Assistant Examiner — Akm Zakaria
(74) Attorney, Agent, or Firm — NSIP Law

(57) ABSTRACT

Provided are a sensing apparatus using a plurality of Hall sensors and an apparatus using the sensing apparatus. The sensing apparatus is configured to measure an intensity of a magnetic field with respect to a magnetic element by using a plurality of Hall sensors and to identify a body that includes the magnetic element.

18 Claims, 12 Drawing Sheets

(56) References Cited

U.S. PATENT DOCUMENTS

2014/0070796 A1* 3/2014 Reymond .............. G01D 5/145
    324/207.2
2014/0361766 A1* 12/2014 Rohrer ............... G01R 33/0094
    324/251

FOREIGN PATENT DOCUMENTS

| JP | 8-330646 A | 12/1996 |
|----|---|---|
| JP | 2001-159953 A | 6/2001 |
| JP | 2006-38777 A | 2/2006 |
| JP | 2008-304222 A | 12/2008 |
| JP | 2011-43331 A | 3/2011 |
| WO | WO 2011/021521 A1 | 2/2011 |

\* cited by examiner

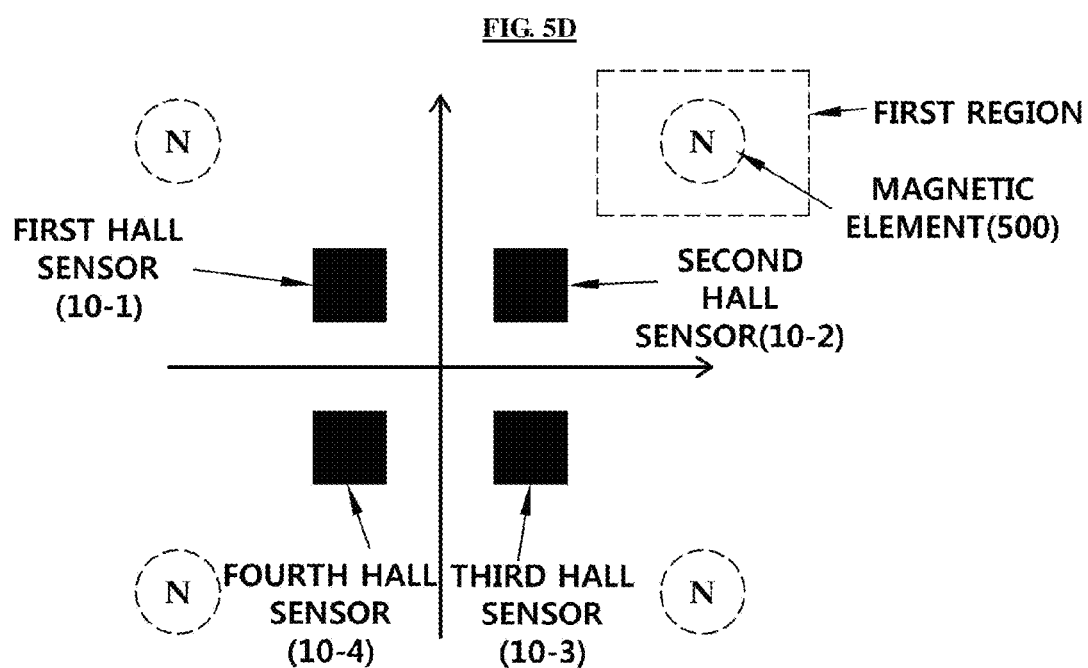

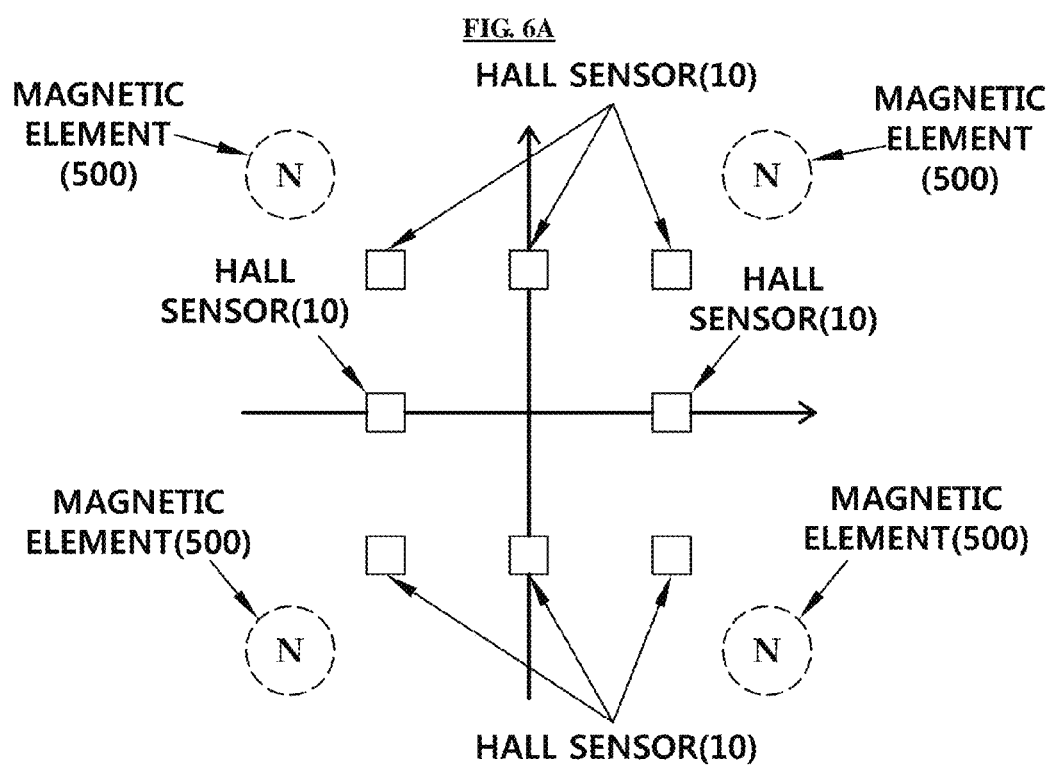

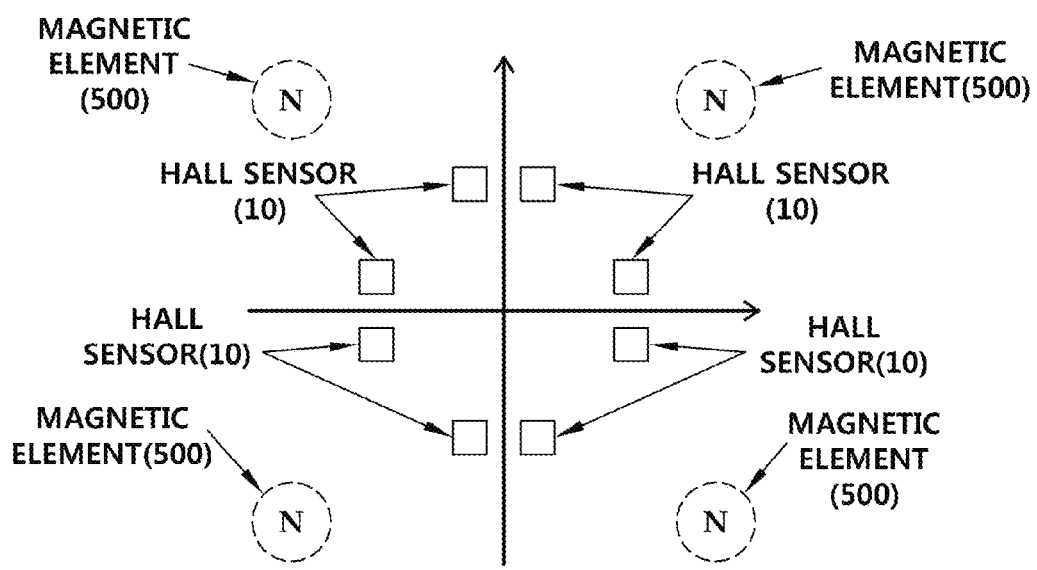

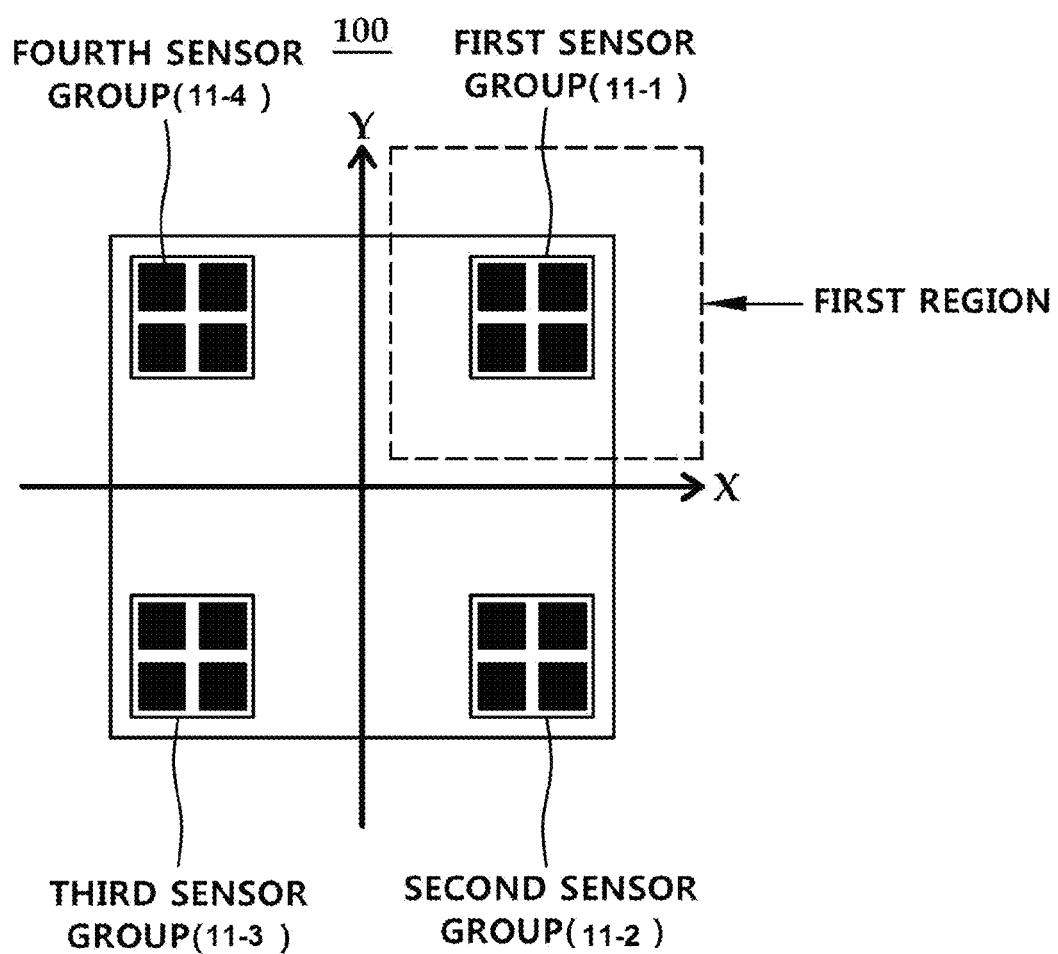

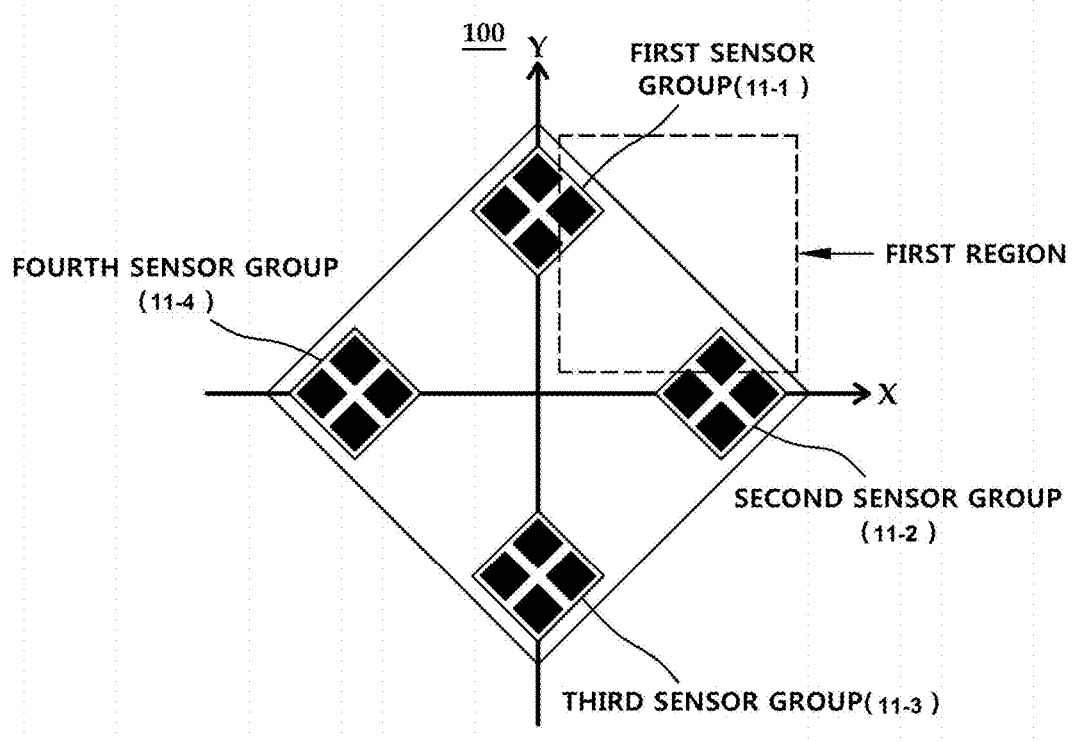

SENSING APPARATUS USING GROUPS OF HALL SENSORS AND APPARATUS USING THE SENSING APPARATUS

CROSS-REFERENCE TO RELATED APPLICATIONS

This application claims the benefit under 35 U.S.C. § 119(a) of Korean Patent Application No. 10-2014-0052766 filed on Apr. 30, 2014, in the Korean Intellectual Property Office, the entire disclosure of which is incorporated herein by reference for all purposes.

BACKGROUND

1. Field

The following description relates to a sensing apparatus that uses groups of Hall sensors and an apparatus using the sensing apparatus. The sensing apparatus is capable of identifying a body that includes a magnetic element by using groups of Hall sensors.

2. Description of Related Art

Usually, a folding mobile terminal, such as a covered type or a folder type terminal, is configured to connect a channel or operate a lamp of a display module by means of detecting an opening and closing of the covered terminal and controlling a terminal in response. A folding mobile terminal is usually divided into first and second structures and refers to a terminal in which two structures are connected to each other, and the structures are opened or closed (hereinafter "folding mobile terminal"). That is, when a user opens a covered terminal upon receipt of a message or call, a channel is connected, and when a user closes a covered terminal, a channel is disconnected. Further, when the user opens a covered terminal, a lamp of the terminal is powered on, such as a backlight. Thus, the user may easily see a display module of the opened covered terminal.

In the above-mentioned terminal, typically, a reed switch made of a magnetic substance having a permanent magnet and elasticity is used to detect an opening and closing of the cover terminal. A reed switch is an electrical switch operated by an applied magnetic field. Further, in various terminal models, by variably amplifying a voltage which is output at a Hall sensor, being of an appropriate shape and size according to the terminal model and design, sensitivity of a switch may be controllable without changing a magnet of the reed switch or modifying a distance between the magnet and the magnetic substance.

In some approaches, only one Hall sensor is used to detect whether the folding mobile terminal is open or closed. The opening or closing of the folding mobile terminal is identified in these approaches by determining whether a sensor value obtained by the one sensor is greater than a certain value. That is, such a sensing apparatus only detects a magnitude of magnetic field from the magnet. Further, such an apparatus operates dichotomously in accordance with the magnitude of the detected value, in that the magnitude alone simply determines whether the folding mobile terminal is open or closed.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

The present examples provide a sensing apparatus capable of detecting one or more of polarity, position, and intensity with respect to a magnetic element and an apparatus using the sensing apparatus.

Also, the present examples provide a sensing apparatus capable of identifying a second body including a magnetic element by using sensed data and an apparatus using the sensing apparatus.

Further provided are a sensing apparatus capable of measuring an angle between a first body that includes a sensor unit and a second body that includes a magnetic element, as a way to use sensed data, and an apparatus using such a sensing apparatus.

In one general aspect, a sensing apparatus includes Hall sensors arranged symmetrically to each other, and a magnetic element disposed at a distance from the Hall sensors and configured to generate a magnetic field, wherein the Hall sensors are configured to sense a magnetic field intensity of the magnetic element.

The sensing apparatus may further include a sensing unit including the Hall sensors and configured to determine magnetic field intensity values, a signal amplifier configured to amplify the magnetic field intensity values, an offset controller configured to control offset values of the magnetic field intensity values, and a controller configured to compare the magnetic field intensity with a predetermined threshold.

The sensing unit may include Hall sensors arranged such that the sensing apparatus is configured to detect which Hall sensor is closest to the magnetic element.

The sensing apparatus may be configured to provide a three dimensional position of the magnetic element.

The Hall sensors may arrange at least one Hall sensor on each quadrant between two axes that are perpendicular to each other.

Each of the Hall sensors may include highly doped contact regions formed on a semiconductor substrate, a junction region adjacent to the contact region, a sensing region below the junction region, and a guard ring surrounding the sensing region.

In another general aspect, an apparatus sensing a magnetic field includes a first body having sensor groups symmetric to each other, and a second body having a magnetic element that is attached to the first body, wherein the magnetic element generates a magnetic field, and wherein each of the sensor groups comprises Hall sensors and detects the magnetic field.

The apparatus may further include a sensing unit having the sensor groups and configured to sense magnetic field intensity values for the sensor groups, an offset controller configured to determine an offset value of the magnetic field intensity, and a controller configured to identify the second body by using the offset value.

Each of the sensor groups may include four Hall sensors.

Each of the sensor groups may be disposed to a corner such that the sensor groups are arranged to have a rectangular shape or to have a diamond shape.

The controller may have a predetermined threshold and may be configured to determine whether the second body covers or lays open the first body by comparing the predetermined threshold with the measured magnetic field intensity values.

The controller may be configured to determine an angle between the first body and the second body using the measured magnetic field intensity values The magnetic field intensity value for a sensor group may be an average value of sensed values from Hall sensors that exist inside the sensor group.

In another general aspect, a sensing apparatus includes two or more pairs of Hall sensors arranged symmetrically to each other, and a magnetic element disposed at a distance from the Hall sensors and configured to generate a magnetic field, wherein the Hall sensors are configured to sense a magnetic field intensity of the magnetic element.

The sensing apparatus may further include a sensing unit comprising the Hall sensors ad configured to determine magnetic field intensity values, a signal amplifier configured to amplify the magnetic field intensity values, an offset controller configured to control offset values of the magnetic field intensity values, and a controller configured to compare the magnetic field intensity with a predetermined threshold.

The Hall sensors may arrange at least one Hall sensor on each quadrant between two axes that are perpendicular to each other.

The Hall sensors may arrange at least one Hall sensor on each axis of two axes that are perpendicular to each other.

Each of the Hall sensors may be disposed to a corner such that the sensors are arranged to have a rectangular shape or to have a diamond shape.

Other features and aspects will be apparent from the following detailed description, the drawings, and the claims.

BRIEF DESCRIPTION OF THE DRAWINGS

FIGS. 5A to 5D are diagrams illustrating an arrangement method of a sensing unit in accordance with an example and an arrangement method of a magnetic element accordingly available for the arrangement.

FIGS. 6A and 6B are diagrams illustrating an arrangement method of a sensing unit in accordance with an example and an arrangement method of a magnetic element accordingly available for the arrangement.

FIGS. 7A and 7B are diagrams illustrating an arrangement method of a sensing unit in accordance with an example and an arrangement method of a magnetic element accordingly available for the arrangement.

Figure 1:
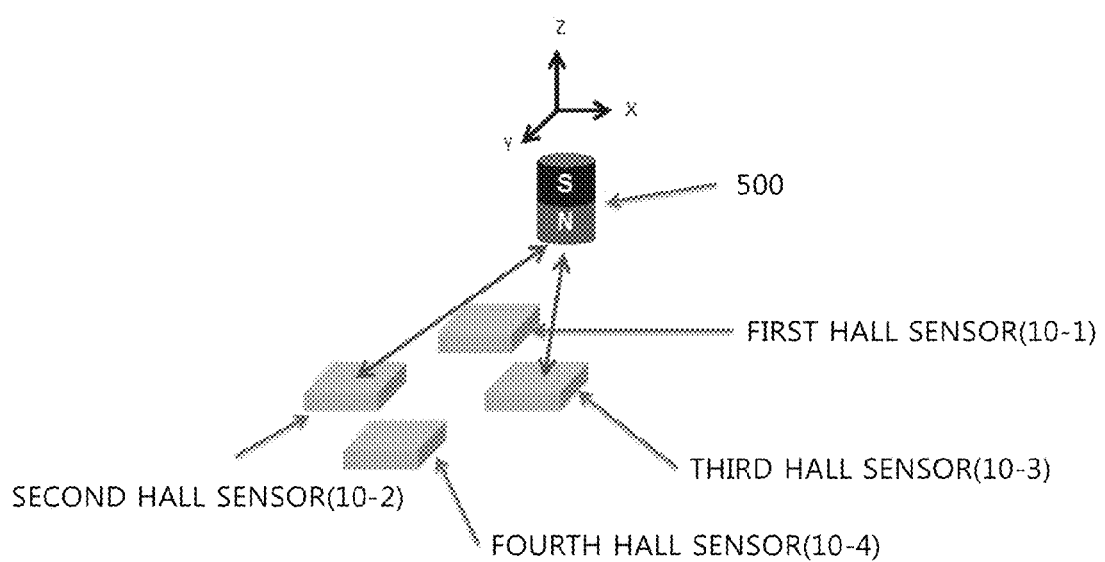
FIG. 1 is a diagram illustrating an arrangement of a magnetic element and Hall devices/sensors according to an example.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Advantages, features and a method of achieving them are described with reference to the accompanying drawings in which some examples are shown. However, other appropriate examples are possible and examples are not to be construed as limited to the examples set forth herein.

It is to be understood that, although the terms first, second, A, B, etc. may be used herein in reference to elements of the examples, such elements are not to be construed as limited by these terms. For example, a first element could be termed a second element, and a second element could be termed a first element, without departing from the scope of the present examples. Herein, the term "and/or" includes any and all combinations of one or more of its referents.

The terminology used herein is for the purpose of describing particular examples only and is not intended to be limiting of the present examples. As used herein, the singular forms "a," "an" and "the" are intended to include the plural forms as well, unless the context clearly indicates otherwise. It is to be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Hereinafter, examples are described with reference to the accompanying drawings.

A Hall voltage measured by using a Hall sensor is in direct proportion to a magnetic field. For example, such a Hall voltage corresponds to a magnitude of the magnetic field or magnetic field intensity or magnetic force. However, such magnitude is in inverse proportion to a squared distance as the distance increases between the Hall sensor and the source of the magnetic field. Also, the magnetic field is relative to an area of the magnet. Thus, using two or more Hall devices allows determination of a position of the magnetic element. By way of example, as illustrated in FIG. 1, four Hall devices are arranged. The four Hall devices are arranged at different positions. If the magnetic field intensity with respect to the second Hall device 10-2 and the third Hall device 10-3 is measured, the second Hall device 10-2 has a distance R1 from the magnetic element and the third Hall device 10-3 has a distance R2 from the magnetic element 500. Since the magnetic field is in inverse proportion to the square of the distance, it is possible to infer a distance by comparing magnetic fields while considering the inverse proportion to the square of the distance. Further, since R2 distance is shorter than R1, a magnitude of the magnetic field measured by the third Hall device 10-3 is thus larger. This makes it possible to identify a position on which the magnetic element 500 is biased based on known information about the positions of the second Hall device 10-2 and the third Hall device 10-3. Here, it can be determined that the element is closer to the third Hall device rather than the second Hall device.

Also, the magnetic element has an north (N) pole and an south (S) pole. It is possible to identify whether the N pole is close to the third Hall device or whether the S pole is closer thereto. Such determination is possible because, the direction of magnetic lines of force start from the N-pole and enters to the S pole such that it is possible to know which pole is closer. As a result, the polarity of the magnetic element is identified. Also, in cases where, in the magnetic element 500 installed in an orientation where an N pole is at a lower portion and an S pole is at an upper portion and conversely in cases where the magnetic element is installed in an orientation where the S pole is at a lower portion and the N pole is at an upper portion, it is possible to read the difference using two or more Hall devices.

Here, the sensing apparatus is characterized in that the Hall sensors are symmetrical to each other and that the Hall sensor senses a magnetic field of the magnetic element in a way so as to sense information about the magnetic element that is formed separately from the Hall sensor. The term "Hall sensor" herein is used to have the same meaning as the term "Hall device". The Hall device refers to a device capable of measuring a Hall voltage and/or a Hall current when the magnetic field is generated. Also, the Hall device may be referred to as a "Hall element".

Figure 2:
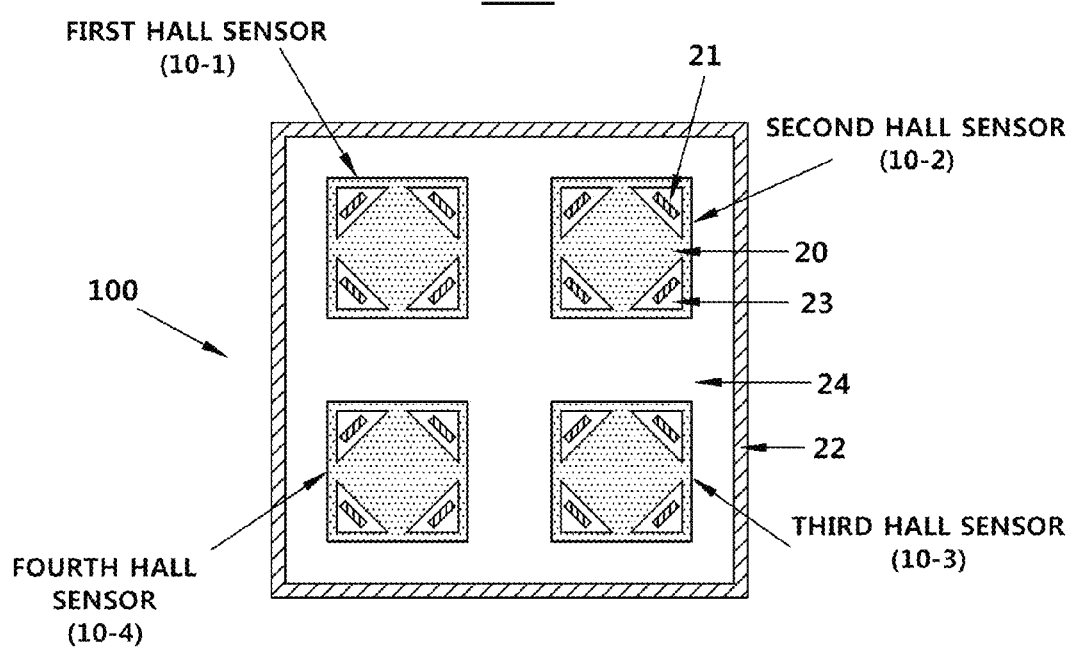
FIG. 2 is a diagram illustrating a sensing unit that includes a Hall devices/sensors of an example.

FIG. 2 is a plan view illustrating a sensing unit 100 consisting of four Hall sensors or Hall devices. First, by using a semiconductor substrate, four Hall devices or Hall sensors 10-1, 10-2, 10-3, 10-4 are formed in the semiconductor substrate. There exists in the semiconductor substrate a highly doped guard ring 22 that has a P-type conductivity that surrounds four Hall devices 10-1, 10-2, 10-3, 10-4. Also, at each and every Hall device/sensor, there exist highly doped four contact regions 21 having a N-type conductivity. The highly doped contact regions 21 are necessary for applying a Hall current or measuring a Hall voltage. A junction region 20 having a P-type conductivity is disposed adjacent to the highly doped contact regions 21. A junction region 20 reduces the semiconductor surface effect which generates noise in signals.

Though not shown in the drawings, a sensing region of an N-type conductivity exists underneath the highly doped junction region 20. The sensing region senses a Hall voltage through the highly doped contact region 21. The highly doped junction region 20 serves to protect the sensing region. If there is a defect on a surface, a flow of a Hall current is distorted, thereby causing a noise component to be increased. The highly doped junction region 20 is needed to cover a surface of the semiconductor substrate. A first isolation region 23 filled with an insulating material surrounds the highly doped contact region 21. This isolation region is for providing an electrical isolation from the highly doped junction region 20. There also exists a second isolation region 24 between the four Hall sensors 10-1, 10-2, 10-3, 10-4 and the guard ring of P-type 22 for providing an electrical isolation. Also, the guard ring 22 and the highly doped junction region 20 are connected electrically with each other and are connected to a ground region, not shown, for a ground.

Further, four Hall devices are used because a Low-noise amplifier (LNA) input terminal is configured to use four inputs to achieve good results. In other words, since the input terminal of the signal amplifier 200 is configured to have four inputs, four Hall devices are thus used in one bundle. Examples are designed such that two Hall sensors that face each other are used to offset the measurements from one another. Using a total of four Hall devices/sensors, an input signal is configured to be increased by two four times. By use of such an approach, the approach allows that the sensitivity of the magnetic field is increased by two or more times by comparison to cases of using only two Hall devices and that the accuracy is so increased.

Figure 3:
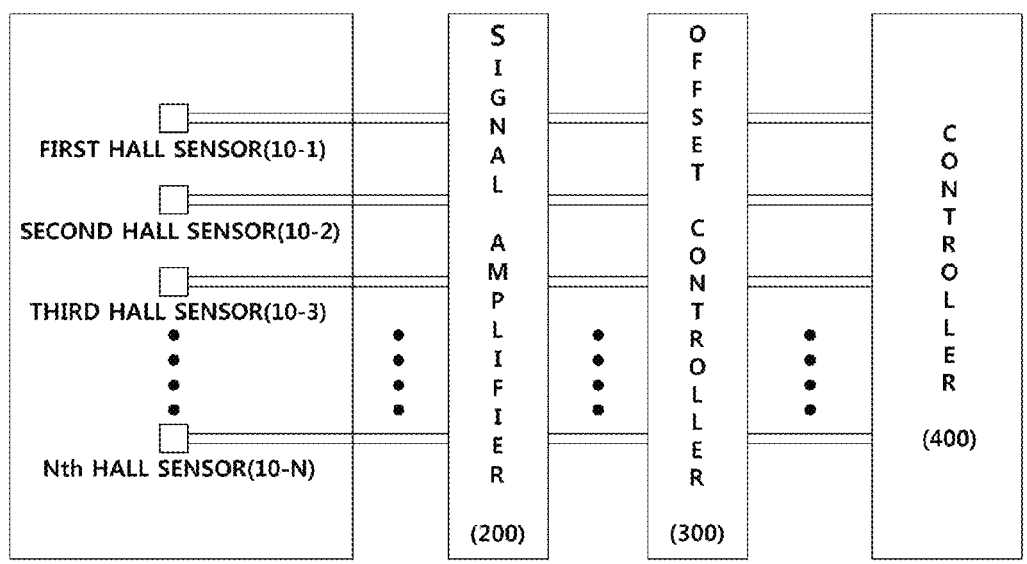
FIG. 3 is a diagram illustrating a sensing apparatus according to an example.

FIG. 3 is a diagram illustrating a sensing apparatus according to an example. As illustrated in FIG. 3, a sensing apparatus 1 includes a sensing unit 100, a sensing amplifier 200, and an offset controller 300. The sensing unit 100 includes multiple Hall sensors 10 and is configured to detect a magnetic field generated by a magnetic element 500 and to provide the magnetic field intensity or magnetic force. The signal amplifier 200 is configured to amplify the magnetic field intensity measured by the sensing unit 100. The offset controller 300 is configured to provide offsets values of the sensed values that correspond to magnetic field intensity. The sensing apparatus 1 optionally further includes a controller 400 configured to compare the magnetic field intensity with a predetermined threshold.

In a folding mobile terminal as discussed above, the first body includes a sensor chip. In the sensor chip, a sensing unit, a controller, and an offset controller as disclosed are included. A magnetic element 500 is formed in a second body which is attached or connected to the first body. Herein, the second body covers or opens to reveal the first body. In the example, the controller senses whether the second body covers or opens to reveal the first body.

First, the sensing unit 100 includes multiple Hall sensors 10. Thus, the sensing unit 100 is configured to include two or more Hall sensors 10. The Hall sensor 10 refers to an apparatus that generates a voltage according to an intensity of the magnetic field which is applied by an additional, external magnetic element 500. The Hall sensor 10 identifies a direction and an intensity regarding the magnetic field it sense by applying a Hall effect in which, when a magnetic field is applied to a conductor in which a current flows, a voltage is generated in a perpendicular direction with respect to current and magnetic field.

The controller 400 identifies a second body in which the above magnetic element 500 is formed based on sensed data by the sensing unit 100. Specifically, the controller 400 is capable of detecting one or more of the polarity, position, and intensity with respect to the magnetic element 500 in a way so as to sum the sensed values and capable of thereby identifying the second body by considering the detected data.

Since the sensing unit 100 includes the multiple Hall sensors 10, the controller 400 is capable of detecting one or more of the polarity, position, and intensity with respect to the magnetic element 500, which are detected by each Hall sensor 10 in a way to use and combine the sensed values which are collected from the multiple Hall sensors 10.

In an example, the controller 400 detects a magnetic field transferred by the magnetic element 500 by using values sensed of the sensing unit 100 that are amplified by the signal amplifier 200. In such an example, since a current value that is generated at one Hall sensor 10 potentially has a very small value, a higher credibility in the controller 400 is obtained with respect to magnetic field of the magnetic element 500 by amplifying the sensed values by means of the signal amplifier 200.

Also, the controller 400 allows the magnetic field applied by the magnetic element 500 to be detected by using the sensed value of the sensing unit 100, which is controlled by the offset controller 300. Having the sensed values compensated by the offset controller 300, the controller 400 becomes capable of detecting the magnetic field of the magnetic element 500 with a higher credibility. For example, the sensed value may be an average value of the sensed value from the plurality of Hall sensors that exist inside one sensor group.

Further, in an example the controller 400 is configured to identify a second body in which the magnetic element 500 is formed by processing the sensed data of the magnetic element 500. More specifically, the controller 400 identifies the second body in which the magnetic element 500 is formed by using one or more detected data regarding the polarity, position, and intensity of the sensed magnetic element 500. In an example, the second body indicated herein includes a cover configured to cover a monitor or display of the first body. In another example, the second body is a pen-typed device or a structure which is capable of touching the monitor or display of first body.

By comparing an intensity of the magnetic field in the controller 400 based on the data discussed, it is possible for the controller 400 to identify the polarity, position, and intensity of the magnetic element 500 that is formed inside the second body. As such, using two or more Hall devices, the controller 400 is capable of identifying the second body in which the magnetic element 500 is formed using one or more detected data regarding the polarity, position, and intensity of the detected magnetic element 500.

In some examples, the controller 400 identifies the second body in which the magnetic element 500 is formed by utilizing all the data regarding the polarity, position, and intensity of the magnetic element 500. To this end, a sensing apparatus 1 according to one embodiment of the present disclosure further includes a look-up table storage, not illustrated, configured to store the identification data of the second body corresponding to the detected data of the magnetic element 500. In such examples, the controller 400 identifies the second body in which the magnetic element 500 is formed based on the data stored in the above look-up table storage, not illustrated.

Hereinafter, through FIGS. 4, 5A-5D, 6A-6B and 7A-7B, an arrangement method of a sensing unit applicable to an example and a magnetic element 500 accordingly available for the arrangement is described further.

Figure 4:
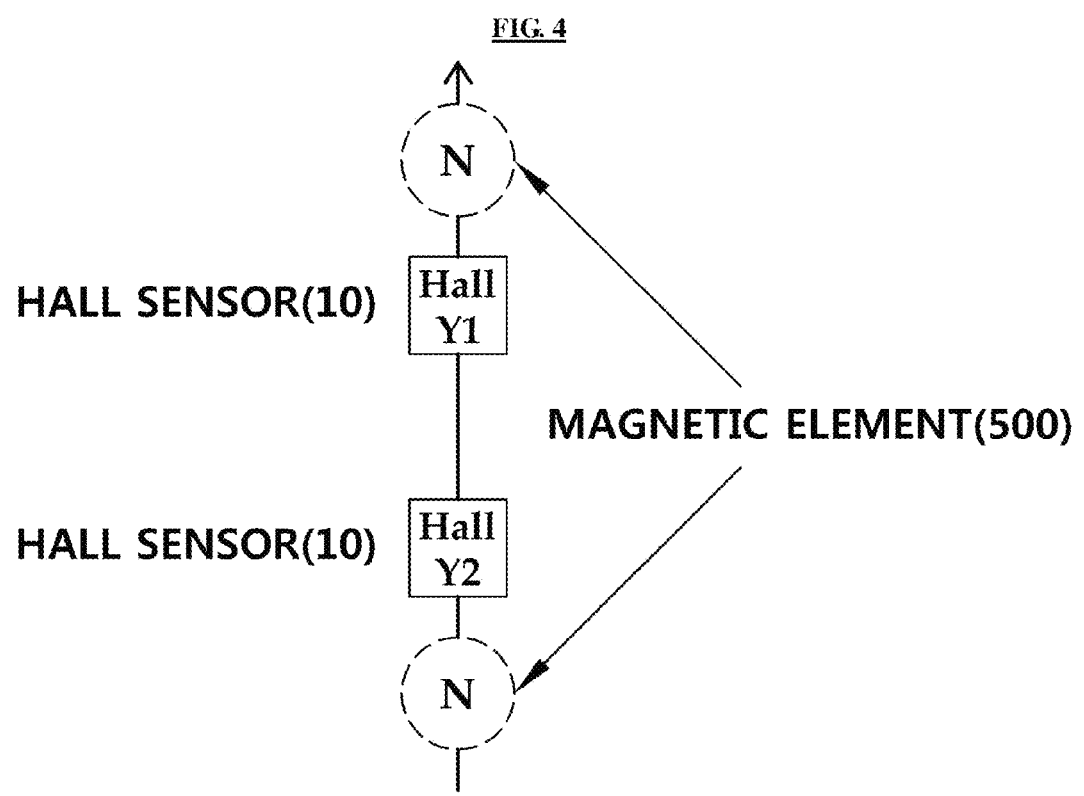
FIG. 4 is a diagram illustrating an arrangement method of a sensing unit in accordance with an example and an arrangement method of a magnetic element accordingly available for the arrangement.

FIG. 4 is a diagram illustrating an arrangement method of a sensing unit in accordance with an example and an arrangement method of a magnetic element accordingly available for the arrangement. As illustrated in FIG. 4, in the first example, the sensing unit 100 includes two Hall sensors 10.

The magnetic element 500, alternatively referred to as a magnetic module, formed at the second body may be positioned to be close to a specific Hall sensor 10 on one axis on which the two Hall sensors 10 are formed. Specifically, the second body included of the magnetic element 500 is devised to cover the first body that includes the sensing unit 100. Thus, the magnetic element 500 is rendered isolated by a certain distance from one side of the first body, formed on a parallel plane, and also positioned closely to a specific Hall sensor 10 among two Hall sensors 10. Here, the first body comprises a chip in which a Hall sensor is formed. A sensing unit exists inside the chip. In an example, the same as above is also applied to the controller.

The controller 400 is capable of detecting which one of two Hall sensors 10 the magnetic element 500 is positioned as being close to, based on the sensed value obtained through the two Hall sensors 10. In one example, the controller 400 is configured to detect whether the magnetic element 500 is positioned to be close to an upper sided or lower sided Hall sensor 10, in a way so as to compare a magnitude of the sensed value of the upper sided Hall sensor 10 and the lower sided Hall sensor 10. Of course, at the same time, in other examples the controller 400 is configured to detect the polarity and intensity with respect to the magnetic element 500.

Disclosed below is a sensing apparatus in which a sensing unit includes three or more Hall sensors. A controller detects three-dimensional position data of the magnetic element based on sensed data obtained through each Hall sensor.

Figure 5A:
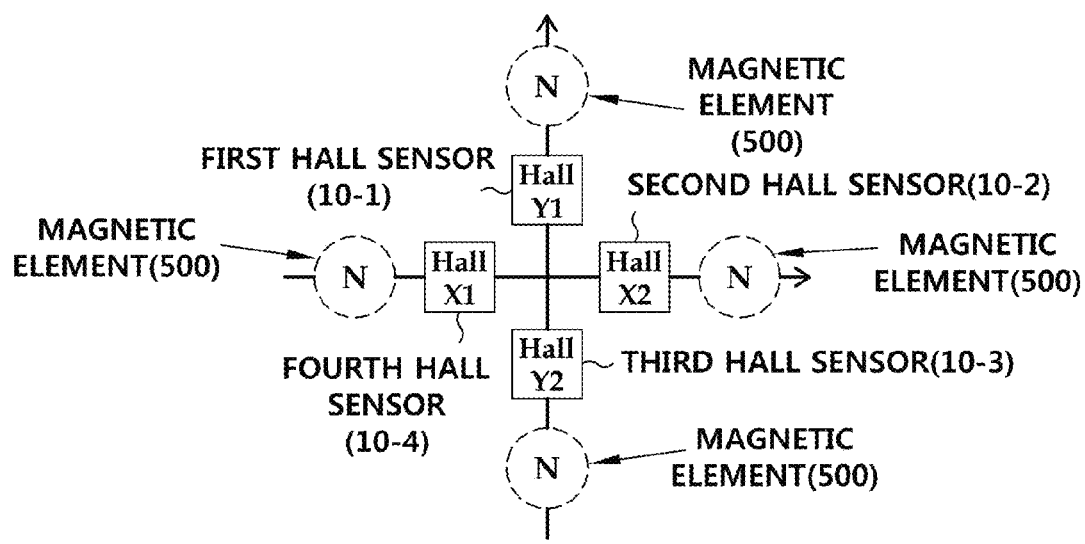
Figure 5B:
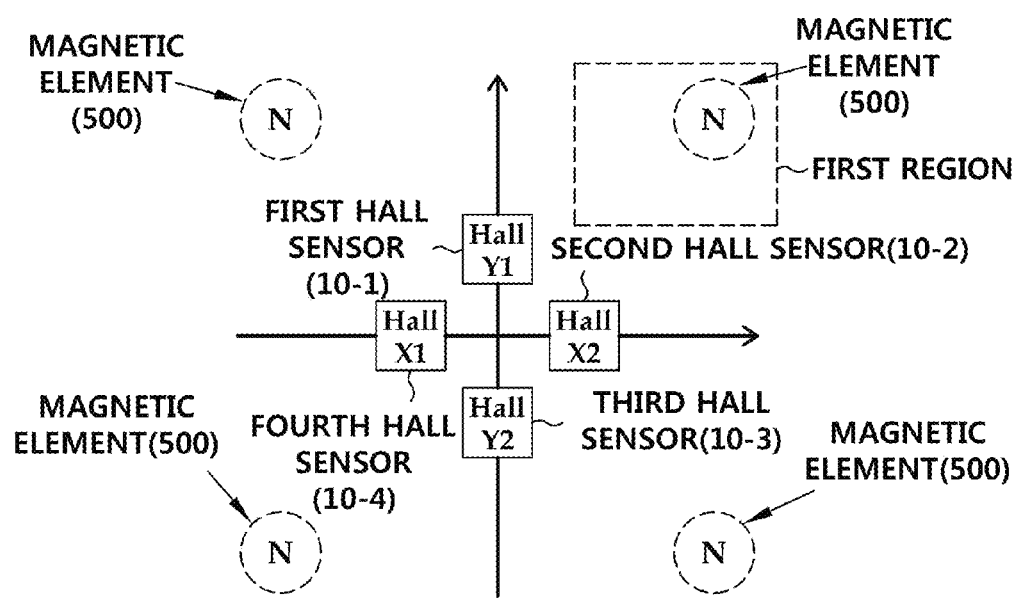

FIG. 5 is a diagram illustrating an arrangement method of a sensing unit in accordance with an example and an arrangement method of a magnetic element accordingly available for the arrangement. As illustrated in FIG. 5, in this example, the sensing unit 100 includes four Hall sensors 10. As illustrated in FIGS. 5A and 5B, the aforementioned four sensors 10 are formed in pairs, respectively, on two axes that are perpendicular to each other. The four sensors 10 are arranged in a diamond shape.

Figure 5C:
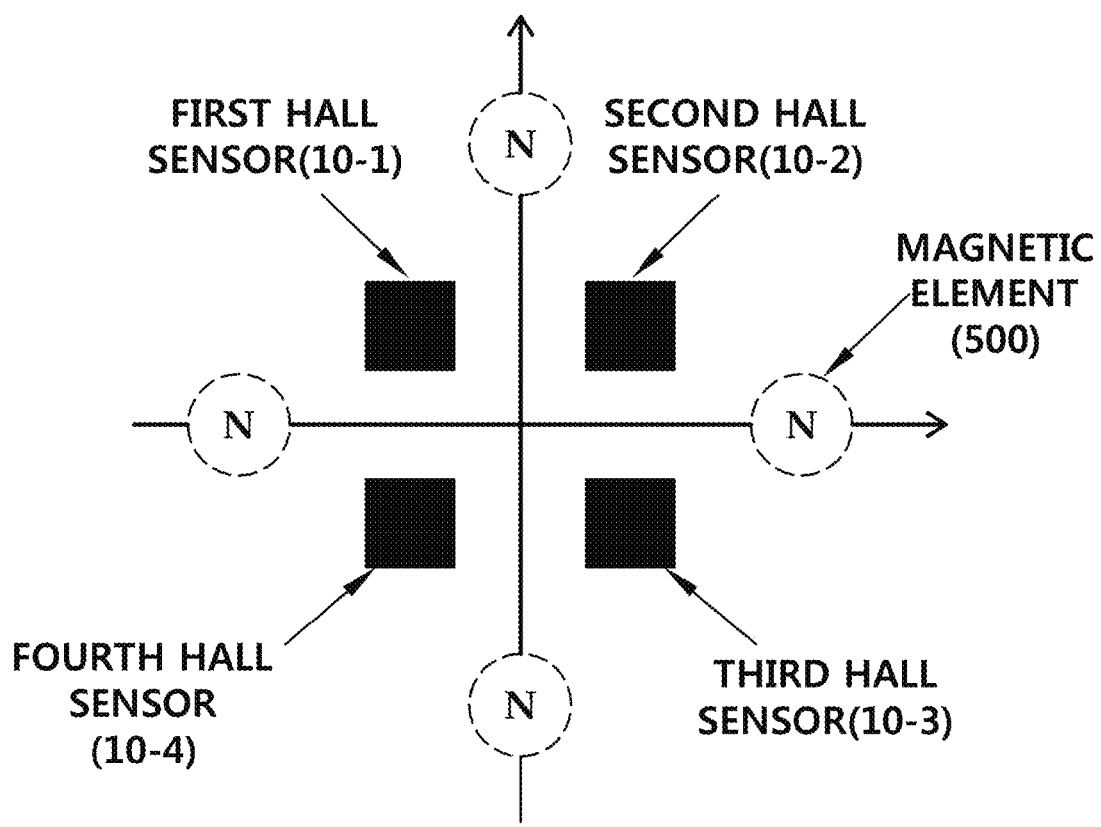

In another example, as illustrated in FIGS. 5C and 5D, the sensing unit includes four Hall sensors, and the four Hall sensors arrange at least one Hall sensor of the Hall sensors on each quadrant between two axes being vertical to each other. In this example, a total of four are arranged respectively in a way so as to face each other on each quadrant. For example, the sensors form a rectangular shape or a diamond shape. These arrangements provide the advantage in that the density of the Hall sensor is potentially denser by a quadrangle form rather than a diamond shape. A magnetic element 500 formed at the second body, is formed on any one of the above two axes or is formed on any one of four regions that are divided by the above two axes. Or, in another example, the magnetic element 500 is arranged just above the Hall sensor or at the true center of the Hall sensors. However it is adequate to be biased slightly toward one side rather than the true center. The intensity of the magnetic field detected by each Hall sensor is then differentiated respectively. By using these approaches, it is possible to detect more easily the polarity, position, and intensity of the magnetic element from values of the intensity regarding the magnetic field.

In FIG. 5A-5D, the above controller 400 is configured to detect where the magnetic element 500 is positioned based on the sensed values obtained from the above four Hall sensors 10. By comparing the magnitude of the respective sensed values of the four Hall sensors 10, it is possible to detect where the magnetic element 500 is positioned.

In one example, like FIG. 5A, if sensed values of the first Hall sensor 10-1 and the third Hall sensor 10-3 are identical in the magnetic element 500, and a sensed value of the second Hall sensor 10-2 is larger than that of the fourth Hall sensor 10-4, it would be determined that the magnetic element 500 is positioned to be close with the second Hall sensor 10-2 on the axis on which the second Hall sensor 10-2 is positioned. Or, if a sensed value of the first Hall sensor 10-1 is larger than that of the third Hall sensor 10-3 and a sensed value of the second Hall sensor 10-2 is larger than that of the fourth Hall sensor 10-4, it would be appreciated that the above magnetic element 500 is positioned at a region, a first region in FIG. 5B close to the first Hall sensor 10-1 and the second Hall sensor 10-2. Of course, at the same time, in some examples the controller 400 detects the polarity and the intensity of the magnetic element 500. In FIGS. 5C and 5D, the polarity and the intensity of the magnetic element 500 are detected in a similar way by comparing sensed values from the Hall sensors 10.

FIGS. 6A-6B are diagrams illustrating an arrangement method of a sensing unit in accordance with an example and an arrangement method of a magnetic element accordingly available for the arrangement. First, as illustrated in FIG. 6A, in the third embodiment, the sensing unit 100 includes eight Hall sensors 10. The eight Hall sensors 10 consist of Hall sensors that are positioned in pairs, respectively, on the first axis (X-axis) and the second axis (Y-axis) and a Hall sensor that is arranged in one on each quadrant. In such an example, values from sensors arranged in a diamond shape and sensors arranged in a quadrangle shape are summed FIG. 6B illustrates a structure in which a total of eight sensors are arranged on each quadrant by pairs.

In this example, the controller 400 detects where the magnetic element 500 is positioned based on the sensed value obtained through the above eight Hall sensors 10. Like FIG. 5, by comparing a magnitude of the sensed value of each of the eight Hall sensors 10, this example detects where the magnetic element 500 is positioned.

In this example, the magnetic element 500 is detected by utilizing more Hall sensors 10 than in the second embodiment. In such an example, a position of the magnetic element 500 is detected having a higher credibility than the example of FIG. 5. Of course, at the same time, the controller 400 is capable of detecting the polarity and the intensity of the magnetic element 500 using similar techniques.

Provided below is further explanation regarding a sensing apparatus characterized in that sensor groups including the multiple Hall sensors are arranged and that the sensor groups are arranged symmetrically to each other.

As illustrated in FIGS. 7A-7B, in the example, the sensing unit 100 includes a total of four sensor groups 11 and each sensor group 11 may include a total of four Hall sensors. The sensing unit thus includes a total of sixteen sensors.

In the example of FIG. 7A, four Hall sensors inside each sensor group 11 are configured in a rectangular shape. Furthermore, the sensor groups 11 themselves are configured in a rectangular shape. Or, as provided in FIG. 7B, four Hall sensors inside each sensor group 11 are configured in a diamond shape, and furthermore, the sensor group 11 as well is configured in a diamond shape. The magnetic element 500 formed at the second body is positioned to be close to the sensing unit 100 in which the above four sensor groups 11 are formed. In examples, the module is formed on one axis among X/Y axes illustrated in FIGS. 7A-7B or is positioned on one region among four regions which are divided by the two axes.

In this case, the controller 400 is capable of detecting where the magnetic element 500 is positioned based on the sensed value provided by each of the above four sensor groups 11. Accordingly, by comparing a magnitude of the sensed value of each of the four Hall sensor groups 11, it is possible to detect where the magnetic element 500 is positioned.

In some examples, if sensed values of the first sensor group 11-1 and the second sensor group 11-2 are identical and a sensed value of the first sensor group 11-1 is larger than that of the third Hall sensor group 10-3, it would be appreciated that the magnetic element 500 is positioned to be close with the first sensor group 11-1 or, the second sensor group 10-2, on the Y axis.

Or, if a sensed value of the first sensor group 11-1 is larger than that of the second sensor group 11-2 and a sensed value of the first sensor group 11-1 is larger than that of the third sensor group 11-3, it would be appreciated that the magnetic element 500 is positioned at a region close to the first sensor group 11-1, a first region in FIG. 5, among regions which are divided by the X and Y axes.

Of course, at the same time, the controller 400 is capable of detecting the polarity and the intensity of the magnetic element 500 as well, as discussed above.

According to the sensing unit 100 configured to be so arranged as the aforesaid examples, the controller 400 detects one or more of the polarity, position, and intensity of the magnetic element 500, preferably, all the three detected data, and to identify the second body through using the detected data. As such, the number of the second body which can be identified by the controller 400 differs in accordance with the kind of the reference value that is stored at the look-up table storage, not illustrated. For example, if the position and the intensity of the detected magnetic element 500 are classified in detail, more second bodies are identifiable.

Also, in the examples, the controller 400 is optionally configured to determine additionally whether the second body including the magnetic element 500 is attached with the first body, so as by using a way to make this judgment based on whether a maximum value is above the preset threshold voltage, among the data regarding the intensity of one or more magnetic elements 500 sensed by the sensing unit 100. In examples, the threshold value is set in advance or be inputted by the user. For example, the threshold value has a specific magnetic field intensity.

That is to say, the controller 400 determines that, in cases where a sensed value of a specific Hall sensor 10 is above a threshold value, chosen as discussed, the second body including the magnetic element 500 almost came into contact with the first body such that the second body is determined to be attached to a side of the first body. In other words, a sensed value is an average value of a sensed value from the plurality of Hall sensors that exist inside one sensor group. Furthermore, based on whether the average value is above the preset threshold value, an example determines whether the second body including the magnetic element is attached with the first body.

In other examples, the controller 400 can operate to turn on and turn off an additional display portion, not illustrated, using data regarding whether attached the first and second bodies are attached. Accordingly, in examples, in response to the controller 400 determining that the second body is attached with a side of the first body, the additional display portion, not illustrated, can be turned off. In response to determining that the second body is not attached with a side of the first body, the additional display portion can be turned on. Hence, the controller 400 causes the display to be active only when the first body is not covered by the second body.

An apparatus having a sensing apparatus 1 of the embodiment suggested herein, includes a sensing unit 100 that includes a first body, a second body that is attachable/detachable with the first body and is formed to include a magnetic element 500, a plurality of Hall sensors 10 that are formed at different positions from each other in the first body, to sense a magnetic field of the magnetic element 500 formed in the second body; and a controller 400 that identifies the second body through sensed data through the sensing unit 100.

The apparatus having the sensing apparatus 1, configured as above, relates to a structure that includes both the first and second bodies as discussed above. Aspects of such an example are substantially identical to the aforementioned example, so further discussion is omitted for brevity.

According to the sensing apparatus and the apparatus using the sensing apparatus, one or more of the polarity, position, and intensity of the magnetic element are detected using groups of Hall sensors.

Also, using the detected data, the second body including the magnetic element can be identified.

Also, using the groups of Hall sensors, three dimensional position data is detected by means of a magnetic element, thereby enabling an angle formed between a first body which includes a sensor unit and a second body which includes a magnetic element to be measured.

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

The apparatuses and units described herein may be implemented using hardware components. The hardware components may include, for example, controllers, sensors, processors, generators, drivers, and other equivalent electronic components. The hardware components may be implemented using one or more general-purpose or special purpose computers, such as, for example, a processor, a controller and an arithmetic logic unit, a digital signal processor, a microcomputer, a field programmable array, a programmable logic unit, a microprocessor or any other device capable of responding to and executing instructions in a defined manner. The hardware components may run an operating system (OS) and one or more software applications that run on the OS. The hardware components also may access, store, manipulate, process, and create data in response to execution of the software. For purpose of simplicity, the description of a processing device is used as singular; however, one skilled in the art will appreciate that a processing device may include multiple processing elements and multiple types of processing elements. For example, a hardware component may include multiple processors or a processor and a controller. In addition, different processing configurations are possible, such as parallel processors.

The methods described above can be written as a computer program, a piece of code, an instruction, or some combination thereof, for independently or collectively instructing or configuring the processing device to operate as desired. Software and data may be embodied permanently or temporarily in any type of machine, component, physical or virtual equipment, computer storage medium or device that is capable of providing instructions or data to or being interpreted by the processing device. The software also may be distributed over network coupled computer systems so that the software is stored and executed in a distributed fashion. In particular, the software and data may be stored by one or more non-transitory computer readable recording mediums. The media may also include, alone or in combination with the software program instructions, data files, data structures, and the like. The non-transitory computer readable recording medium may include any data storage device that can store data that can be thereafter read by a computer system or processing device. Examples of the non-transitory computer readable recording medium include read-only memory (ROM), random-access memory (RAM), Compact Disc Read-only Memory (CD-ROMs), magnetic tapes, USBs, floppy disks, hard disks, optical recording media (e.g., CD-ROMs, or DVDs), and PC interfaces (e.g., PCI, PCI-express, WiFi, etc.). In addition, functional programs, codes, and code segments for accomplishing the example disclosed herein can be construed by programmers skilled in the art based on the flow diagrams and block diagrams of the figures and their corresponding descriptions as provided herein.

As a non-exhaustive illustration only, a terminal/device/unit described herein may refer to mobile devices such as, for example, a cellular phone, a smart phone, a wearable smart device (such as, for example, a ring, a watch, a pair of glasses, a bracelet, an ankle bracket, a belt, a necklace, an earring, a headband, a helmet, a device embedded in the cloths or the like), a personal computer (PC), a tablet personal computer (tablet), a phablet, a personal digital assistant (PDA), a digital camera, a portable game console, an MP3 player, a portable/personal multimedia player (PMP), a handheld e-book, an ultra mobile personal computer (UMPC), a portable lab-top PC, a global positioning system (GPS) navigation, and devices such as a high definition television (HDTV), an optical disc player, a DVD player, a Blu-ray player, a setup box, or any other device capable of wireless communication or network communication consistent with that disclosed herein. In a non-exhaustive example, the wearable device may be self-mountable on the body of the user, such as, for example, the glasses or the bracelet. In another non-exhaustive example, the wearable device may be mounted on the body of the user through an attaching device, such as, for example, attaching a smart phone or a tablet to the arm of a user using an armband, or hanging the wearable device around the neck of a user using a lanyard.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A sensing apparatus, comprising:
   Hall sensors arranged symmetrically to each other, wherein each of the Hall sensors comprises
   highly doped contact regions formed on a semiconductor substrate, a junction region adjacent to the highly doped contact regions, and an isolation region filled with an insulating material surrounding the highly doped contact regions;

a guard ring surrounding the Hall sensors;

another isolation region filled with an insulating material disposed between each of the Hall sensors and the guard ring; and a magnetic element disposed at a distance from the Hall sensors and configured to generate a magnetic field, wherein the Hall sensors are configured to sense a magnetic field intensity of the magnetic element, and the sensing apparatus is configured to provide a three dimensional position of the magnetic element.

2. The sensing apparatus of claim 1, further comprising:

a sensing unit comprising the Hall sensors and configured to determine magnetic field intensity values;

a signal amplifier configured to amplify the magnetic field intensity values;

an offset controller configured to control offset values of the magnetic field intensity values; and a controller configured to compare the magnetic field intensity values with a threshold.

3. The sensing apparatus of claim 2, wherein the sensing unit comprises the Hall sensors arranged such that the sensing apparatus is configured to detect which Hall sensor is closest to the magnetic element.

4. The sensing apparatus of claim 1, wherein the Hall sensors comprise at least one Hall sensor disposed in each of four quadrants defined by two axes that are perpendicular to each other.

5. The sensing apparatus of claim 1, wherein each of the Hall sensors further comprises:

a sensing region below the junction region.

6. An apparatus sensing a magnetic field, comprising:

a first body having sensor groups symmetric to each other with respect to two axes that are perpendicular to each other, wherein each of the sensor groups comprises Hall sensors, and each of the Hall sensors comprises highly doped contact regions formed on a semiconductor substrate, a junction region adjacent to the highly doped contact regions, and an isolation region filled with an insulating material surrounding the highly doped contact regions;

a second body having a magnetic element that is attached to the first body, the magnetic element being disposed in only one of four quadrants divided by the two axes that are perpendicular to each other;

a sensing unit comprising the sensor groups and configured to sense magnetic field intensity values for the sensor groups; and a controller, configured to provide a three-dimensional position of the magnetic element based on the sensed magnetic field intensity values for the sensor groups, wherein the magnetic element generates a magnetic field, and wherein each of the sensor groups comprises Hall sensors configured to detect the magnetic field.

7. The apparatus of claim 6, further comprising:

an offset controller configured to determine an offset value of the magnetic field intensity values, wherein the controller is further configured to identify the second body based on the offset value.

8. The apparatus of claim 6, wherein each of the sensor groups comprises four Hall sensors, and a sensor group is disposed in each of four quadrants defined by the two axes that are perpendicular to each other or two sensor groups are arranged on each axis of the two axes that are perpendicular to each other.

9. The apparatus of claim 6, wherein each of the sensor groups is disposed at a respective corner of a rectangular shape or a diamond shape.

10. The apparatus of claim 6, wherein the controller is further configured to determine whether the second body covers or lays open the first body by comparing the measured magnetic field intensity values with a threshold.

11. The apparatus of claim 6, wherein the magnetic field intensity value for a sensor group is an average value of sensed magnetic field intensity values from Hall sensors that exist inside of the sensor group.

12. A sensing apparatus, comprising:

four or more groups of Hall sensors, the groups being arranged symmetrically to each other, wherein each of the Hall sensors comprises highly doped contact regions formed on a semiconductor substrate, a junction region adjacent to the highly doped contact regions, and an isolation region filled with an insulating material surrounding the highly doped contact regions; and a magnetic element disposed at a distance from the Hall sensors, not overlapped with the Hall sensors, and configured to generate a magnetic field, wherein the Hall sensors are configured to sense a magnetic field intensity of the magnetic element, and the sensing apparatus is configured to provide a three dimensional position of the magnetic element.

13. The sensing apparatus of claim 12, further comprising:

a sensing unit comprising the Hall sensors and configured to determine magnetic field intensity values;

a signal amplifier configured to amplify the magnetic field intensity values;

an offset controller configured to control offset values of the magnetic field intensity values; and a controller configured to compare the magnetic field intensity values with a threshold.

14. The apparatus of claim 6, wherein the controller is further configured to identify the second body based on detected data regarding any one or any combination of any two or more of a polarity, a position, and an intensity of the magnetic element.

15. The sensing apparatus of claim 12, wherein each of the groups of Hall sensors comprises four Hall sensors.

16. The apparatus of claim 6, wherein the Hall sensors in a sensor group are configured in a rectangular shape or in a diamond shape.

17. The sensing apparatus of claim 15, wherein the four Hall sensors in a group of Hall sensors are configured in a rectangular shape or in a diamond shape.

18. The sensing apparatus of claim 1, wherein the other isolation region is surrounded by the guard ring.

* * * * *